(12) United States Patent
Lin et al.

(10) Patent No.: US 12,453,034 B2
(45) Date of Patent: Oct. 21, 2025

(54) DETECTION MECHANISM AND ELECTRONIC DEVICE

(71) Applicant: Fulian Precision Electronics (Tianjin) Co., LTD., Tianjin (CN)

(72) Inventors: Jia-Feng Lin, New Taipei (TW); Chieh-Hsiang Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 287 days.

(21) Appl. No.: 18/235,614

(22) Filed: Aug. 18, 2023

(65) Prior Publication Data

US 2025/0024625 A1    Jan. 16, 2025

(30) Foreign Application Priority Data

Jul. 14, 2023   (CN) .......................... 202310870040.0

(51) Int. Cl.
   *H05K 7/00*        (2006.01)
   *H05K 7/14*        (2006.01)

(52) U.S. Cl.
   CPC .................................. *H05K 7/1487* (2013.01)

(58) Field of Classification Search
   None
   See application file for complete search history.

(56) References Cited

U.S. PATENT DOCUMENTS

| 11,291,134 B2* | 3/2022 | Huang ..................... G06F 1/181 |
| 2009/0153002 A1* | 6/2009 | Kinoshita ........... B60R 11/0205 312/223.1 |

* cited by examiner

*Primary Examiner* — Imani N Hayman
*Assistant Examiner* — Rashen E Morrison
(74) *Attorney, Agent, or Firm* — ScienBiziP, P.C.

(57) ABSTRACT

A detection mechanism and an electronic device, including a mounting rack defining an opening; a door assembly rotatably connected to the mounting rack and configured to rotate relative to the mounting rack to cover or uncover the opening; a first movable rack movably connected to the mounting rack and the door assembly, configured to move forward or return along a first direction or a counter direction of the first direction when the door assembly rotates; a second movable rack movably connected to the first movable rack and configured to move forward or return along a second direction or a counter direction of the second direction when the first movable rack moves; and a detection assembly connected to the second movable rack and configured to detect whether a cover of the electronic device is away from the mounting rack and whether the opening is not covered by the door assembly.

16 Claims, 8 Drawing Sheets

DETECTION MECHANISM AND ELECTRONIC DEVICE

CROSS-REFERENCE TO RELATED APPLICATION(S)

This application claims the benefit of and priority to Chinese Patent Application Serial No. 202310870040.0, filed on Jul. 14, 2023, at China's National Intellectual Property Administration, the contents of which are hereby incorporated herein fully by reference.

FIELD

The subject matter herein generally relates to electronic storage technologies, and particularly to a detection mechanism and an electronic device.

BACKGROUND

Electronic devices may include a mounting rack for mounting a storage module. When assembling or disassembling the storage module, an opening of the mounting rack needs to be made. When maintaining internal components of the electronic device, it is necessary to open a cover of a housing of the electronic device or remove the cover to keep the cover away from the mounting rack. However, at present there is no known detection mechanism that is capable of detecting whether the cover is away from the mounting rack and whether the opening of the mounting rack is unobstructed. So the present electronic device has the problems of high detection cost and large space occupation.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, the reference numerals designate corresponding parts throughout the several views.

DETAILED DESCRIPTION

Implementations of the disclosure will now be described, by way of embodiments only, with reference to the drawings. The disclosure is illustrative only, and changes may be made in the detail within the principles of the present disclosure. It may, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein but are not to be considered as limiting the scope of the embodiments.

Several definitions that apply throughout this disclosure will now be presented.

The term "coupled" is defined as connected, whether directly or indirectly through intervening components, and is not necessarily limited to physical connections. The term "substantially" is defined to be essentially conforming to the particular dimension, shape or other word that the term modifies, such that the component need not be exact. The term "comprising," when utilized, means "including, but not necessarily limited to", it specifically indicates open-ended inclusion or membership in the so-described combination, group, series, and the like.

A detection mechanism applied in an electronic device is provided. The electronic device includes a cover. The detection mechanism includes a mounting rack defining a receiving room and an opening communicated with the receiving room; a door assembly rotatably connected to the mounting rack, the door assembly configured to rotate relative to the mounting rack to cover or uncover the opening; a first movable rack movably connected to the mounting rack and the door assembly, the first movable rack configured to move forward or return along a first direction or a counter direction of the first direction when the door assembly rotates; a second movable rack movably connected to the first movable rack, the second movable rack configured to move forward or return along a second direction or a counter direction of the second direction when the first movable rack moves forward or return along the first direction and the counter direction of the first direction, the second direction perpendicular to the first direction; and a detection assembly connected to the second movable rack, the detection assembly configured to detect whether the cover is away from the mounting rack, the detection assembly further configured to move with the second movable rack to detect whether the opening is not covered by the door assembly.

The detection assembly may detect whether the cover is away from the mounting rack, and detect whether the opening is opened, which may decrease components and a cost for detections, and save spaces for arranging the components for detections.

Figure 1:
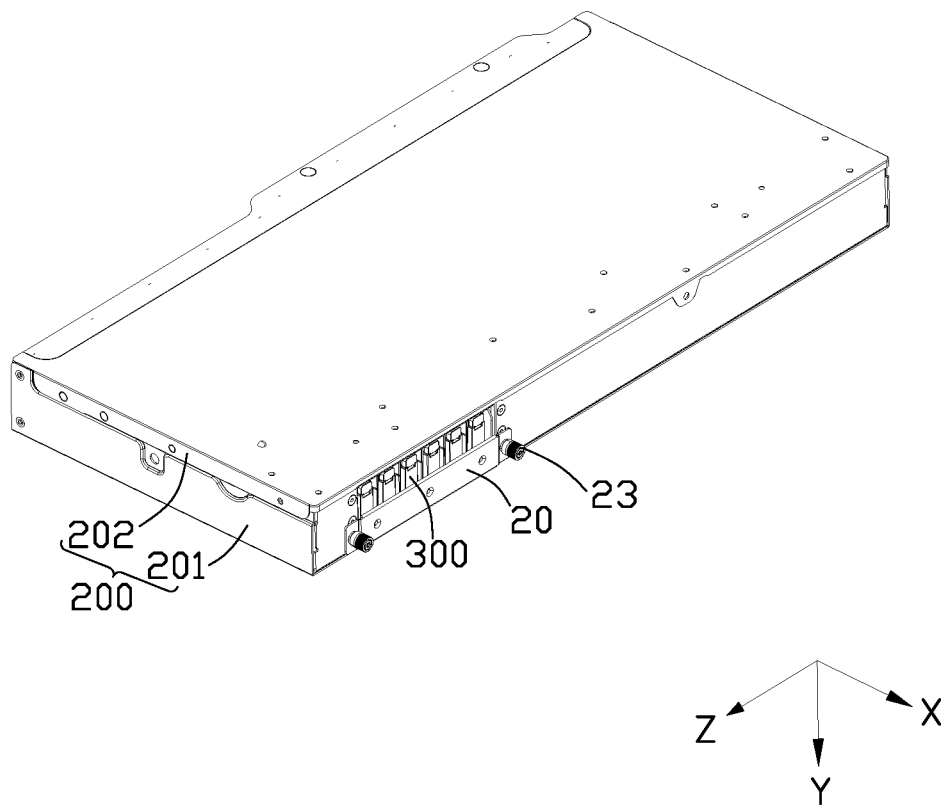
FIG. 1 is a schematic diagram illustrating an electronic device, according to an example embodiment of the present application.

FIG. 1 is a schematic diagram illustrating an electronic device 1000, according to an example embodiment of the present application. The electronic device 1000 includes a housing 200 and a detection mechanism 100. The housing 200 defines a receiving chamber 20a, the detection mechanism 100 may be at least partially received in the receiving chamber 20a.

Figure 2:
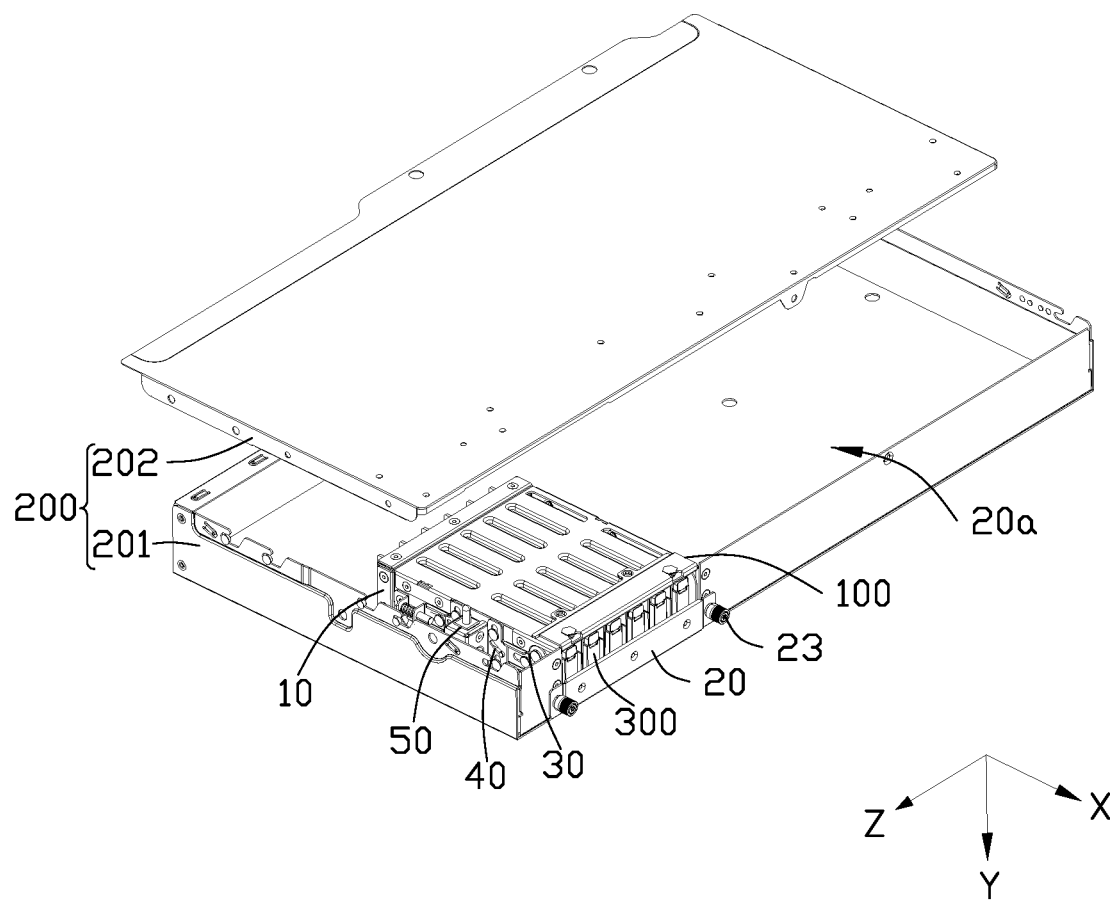
FIG. 2 is a schematic diagram illustrating a cover of the electronic device of FIG. 1, the cover is opened according to an example embodiment of the present application.

In some embodiments, referring to FIGS. 1 and 2, the housing 200 includes a main body 201 and a cover 202. The cover 202 may be connected to the main body 201. The main body 201 and the cover 202 may cooperatively form the receiving chamber 20a.

In some embodiments, referring to FIGS. 1 and 2, the electronic device 1000 further includes a storage module 300. The storage module 300 may be mounted to the detection mechanism 100.

Figure 3:
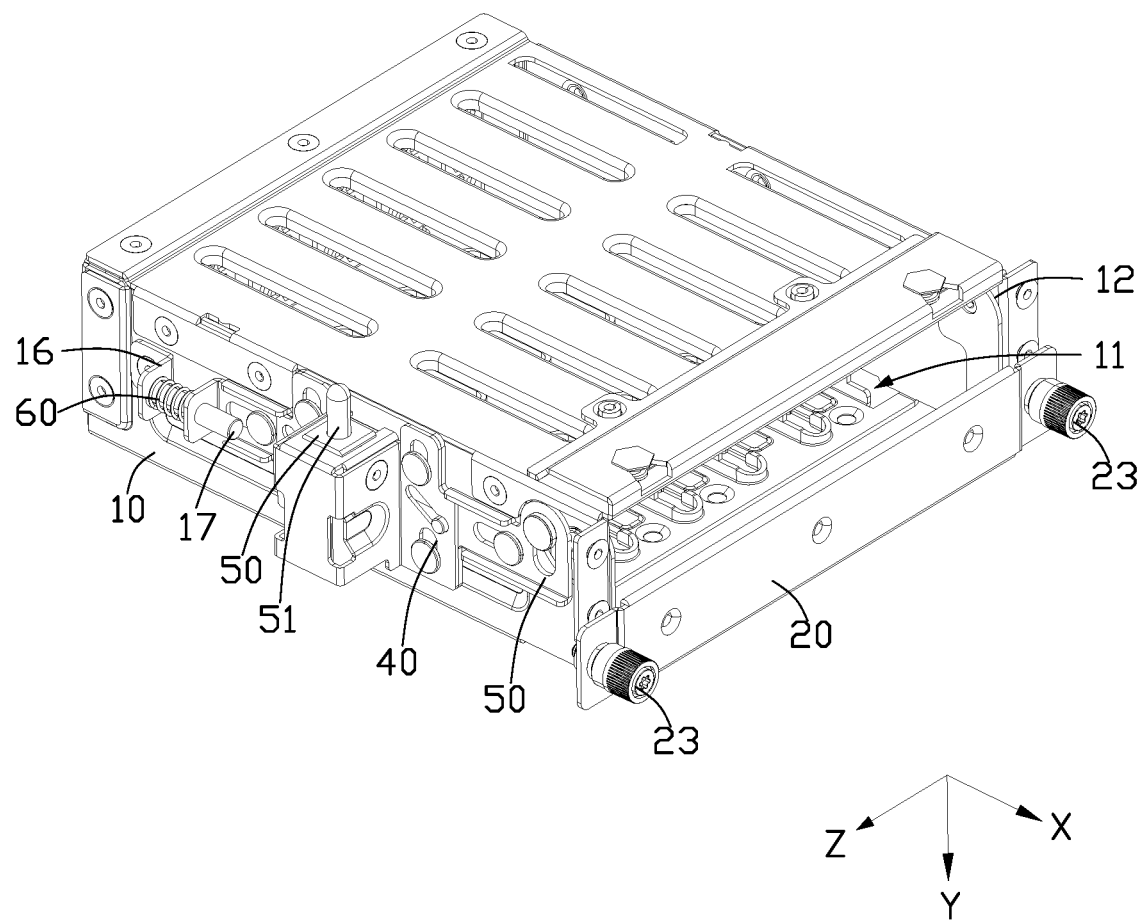
FIG. 3 illustrates a schematic diagram of a detection mechanism, according to an example embodiment of the present application.

In some embodiments, referring to FIGS. 2 and 3, the detection mechanism 100 includes a mounting rack 10, a door assembly 20, a first movable rack 30, a second movable rack 40, and a detection assembly 50. The mounting rack 10 may be connected to the main body 201 or the cover 202. The mounting rack 10 may define a receiving room 11 and an opening 12 communicated with the receiving room 11. The door assembly 20 may be rotatably connected to the mounting rack 10. The door assembly 20 may be configured to rotate relative to the mounting rack 10 to cover or uncover the opening 12. The first movable rack 30 may be movably connected to the mounting rack 10 and the door assembly 20. The second movable rack 40 may be movably connected to the first movable rack 30. The detection assembly 50 may be connected to the second movable rack 40. The detection assembly 50 may be configured to detect whether the cover 202 is away from the mounting rack 10. The detection assembly 50 may be further configured to move with the second movable rack 40 to detect whether the door assembly 20 opens the opening 12.

In some embodiments, the receiving room 11 may be configured to receive the storage module 300, the opening 12 exposes from the receiving chamber 20a for inserting the storage module 300 to the receiving room 11 therethrough by the operator.

Figure 4:
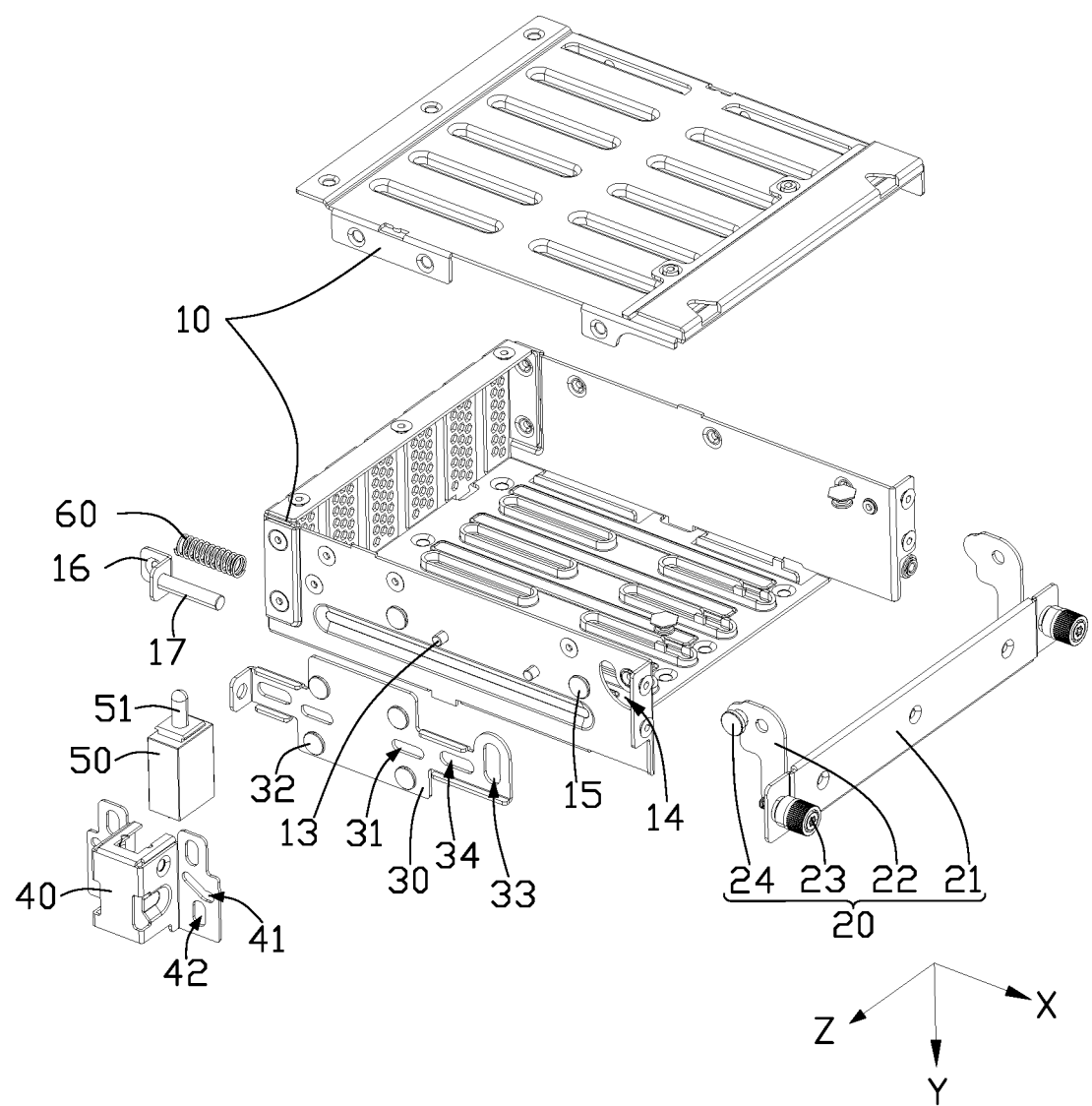
FIG. 4 illustrates an exploded view of the detection mechanism of FIG. 3, according to an example embodiment of the present application.

In some embodiments, referring to FIG. 4, the door assembly 20 includes a board 21 and rotation pieces 22 connected to the board 21. The rotation pieces 22 may be rotatably connected to the mounting rack 10 and be movably connected to the first movable rack 30. The board 21 may be configured to rotate to cover or uncover the opening 12, when the operator moves the board 21, the rotation pieces 22 may rotate relative to the mounting rack 10, since the rotation pieces 22 may be movably connected to the first movable rack 30, so the rotation pieces 22 may drive the first movable rack 30 when it's rotating. The rotation pieces 22 may achieve a synchronous movement of the board 21 and the first movable rack 30.

In some embodiments, referring to FIGS. 3 and 4, the door assembly 20 further includes fixed pieces 23 connected to the board 21. The fixed pieces 23 may be configured to fix the mounting rack 10. The fixed pieces 23 may be beneficial to maintain a status of the board 21 opens the opening 12 or a status of the board 21 closes the opening 12.

In some embodiments, referring to FIGS. 3 and 4, the fixed pieces 23 may be configured to fix the mounting rack 10 when the board 21 closes the opening 12, which may be beneficial to the board 21 maintain a status of closing the opening 12.

In some embodiments, referring to FIGS. 3 and 4, the fixed pieces 23 may be connected to the mounting rack 10 through screws for fixing the board 12 and the mounting rack 10.

Figure 5:
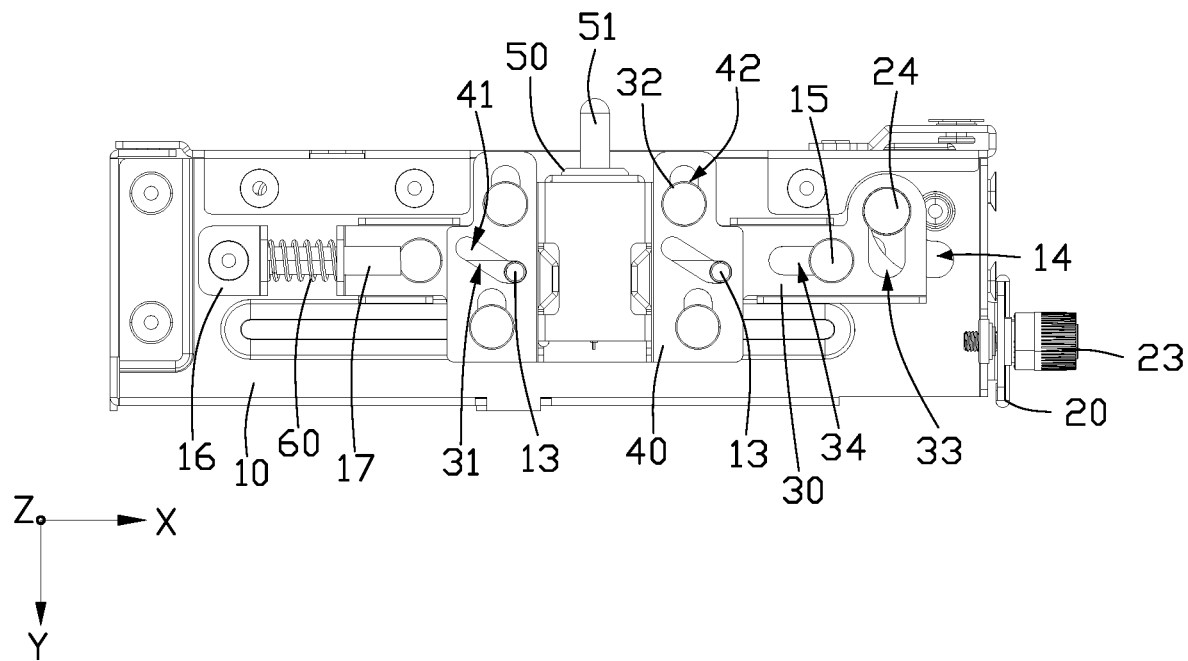
FIG. 5 illustrates a side view of an opening of the detection mechanism, the opening is closed according to an example embodiment of the present application.
Figure 6:
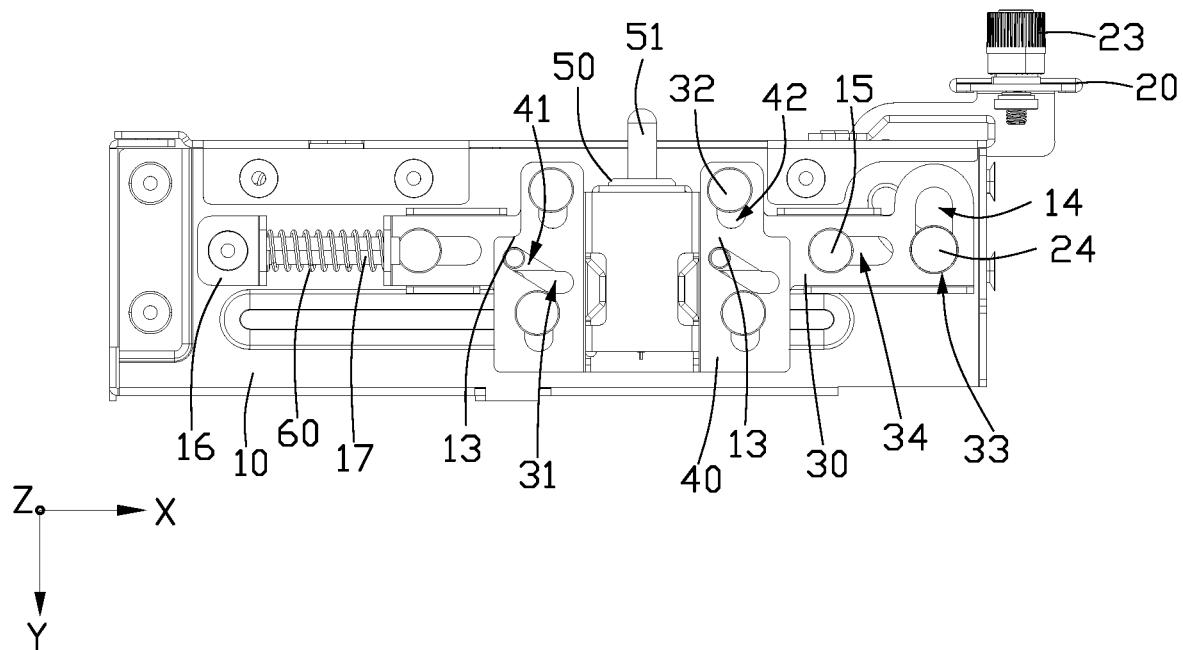
FIG. 6 illustrates a side view of the opening of the detection mechanism, the opening is opened according to an example embodiment of the present application.

In some embodiments, referring to FIGS. 4, 5, and 6, the first movable rack 30 may be configured to move forward or return along a first direction X or a counter direction of the first direction X when the door assembly 20 rotates.

In some embodiments, referring to FIGS. 4, 5, and 6, when the door assembly 20 rotates, the door assembly 20 drives the first movable rack 30 to move forward or return along the first direction X or the counter direction of the first direction X.

In some embodiments, referring to FIGS. 4, 5, and 6, the first movable rack 30 includes a first slide slot 31 extended along the first direction X. The mounting rack 10 includes a first slide piece 13. The first slide piece 13 inserts into the first slide slot 31, so the first slide piece 13 may slide along the first slide slot 31 and move relative to the first movable rack 30. The slide engagement of the first slide slot 31 and the first slide piece 13 may be beneficial to the first movable rack 30 be slidably mounted to the mounting rack 10, and provide a guide for a movement of the first movable rack 30, so the first movable rack 30 may move reposefully, the first slide slot 31 may be further beneficial to limit the movement of the first movable rack 30.

In some embodiments, referring to FIGS. 4, 5, and 6, the second movable rack 40 may be configured to move forward or return along a second direction Y or a counter direction of the second direction Y when the first movable rack 30 moves forward or return along the first direction X or the counter direction of the first direction X. The second direction Y is perpendicular to the first direction X. When the first movable rack 30 move forward or return along the first direction X or the counter direction of the first direction X, the first movable rack 30 may drive the second movable rack 40 to move forward or return along the second direction Y or the counter direction of the second direction Y.

The detection assembly 50 may be connected to the second movable rack 40 and move forward or return along the second direction Y or the counter direction of the second direction Y together with the second movable rack 40. The detection assembly 50 may be configured to detect the cover 202, when disassembling or opening the cover 202, the cover 202 moves relative to the main body 201, the detection assembly 50 may detect that the cover 202 is away from the mounting rack 10. When the cover 202 is not disassembled, the door assembly 20 rotates and opens the opening 12, the door assembly 20 drives the first movable rack 30 to move along the first direction X or along the counter direction of the first direction X, the first movable rack 30 drives the second movable rack 40 to move along the second direction Y or along the counter direction of the second direction Y, the detection assembly 50 moves together with the second movable rack 40, so a distance between the detection assembly 50 and the cover 202 in the second direction Y changes, the detection assembly 50 may detect that the distance between the detection assembly 50 and the cover 202 changes.

The detection assembly 50 may detect that the cover 202 is away from the mounting rack 10 and a relative movement of the detection assembly 50 relative to the cover 202 along the second direction Y, so the detection assembly 50 may detect whether the cover 202 is away from the mounting rack 10 and whether the door assembly 20 opens the opening 12, which may decrease components for detection and detection cost, and also save rooms for the components for detection.

In some embodiments, referring to FIGS. 4, 5, and 6, the cover 202 may be positioned on a side of the detection mechanism 100 in the second direction Y, which may be beneficial to the detection assembly 50 detects the change of the distance between the detection assembly 50 and the cover 202 in the second direction Y.

In some embodiments, referring to FIGS. 4, 5, and 6, the first movable rack 30, the second movable rack 40, and the detection assembly 50 may be positioned on a side of the mounting rack 10 in a third direction Z. The third direction Z is perpendicular to each of the first direction X or the second direction Y. So, the door assembly 20 may move the first movable rack 30, the first movable rack 30 may move the second movable rack 40, the second movable rack 40 may move the detection assembly 50.

In some embodiments, referring to FIGS. 4, 5, and 6, the second movable rack 40 includes a second slide slot 41. At least a part of an extended direction of the second slide slot 41 forms an angle with the first direction X which is less than 90 degrees. The first slide piece 13 is inserted through the first slide slot 31 and inserted into the second slide slot 41, the first slide piece 13 may slide along the extended direction of the second slide slot 41 and move relative to the second movable rack 40.

When the first movable rack 30 moves along the first direction X or the counter direction of the first direction X, since the first slide piece 13 is inserted into the second slide slot 41, when the second movable rack 40 moves along the extended direction of the second slide slot 41, the angle between the at least a part of the extended direction of the second slide slot 41 and the first direction X is less than 90 degrees, so the second moveable rack 40 may move a certain distance in the second direction Y or the counter direction of the second direction Y. The first slide piece 13 is inserted through the first slide slot and inserted into the second slide slot 41, which may be beneficial to the first slide piece 13 to provide a guide and support to the movement of the first movable rack 30, and beneficial to the second movable rack 40 to move along the second direction Y or the counter direction of the second direction Y, for simplifying the entire structure and good for manufacture.

Figure 7:
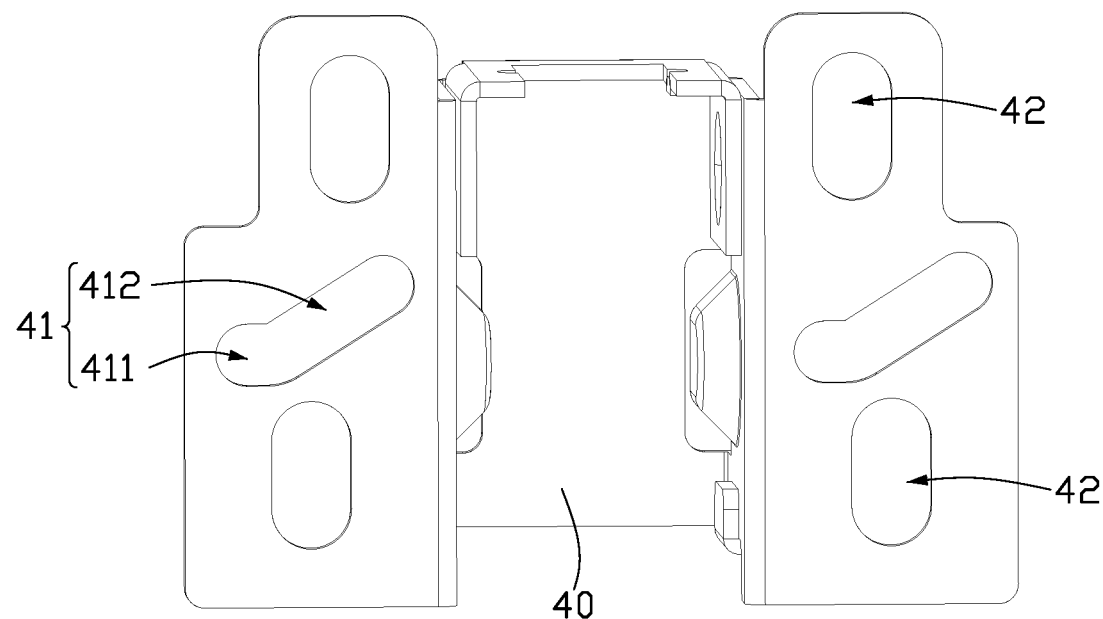
FIG. 7 illustrates a schematic diagram of a second movable rack, according to an example embodiment of the present application.
Figure 7:
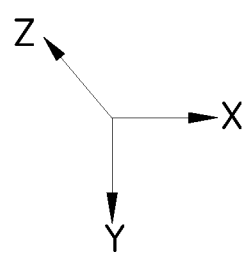
Figure 8:
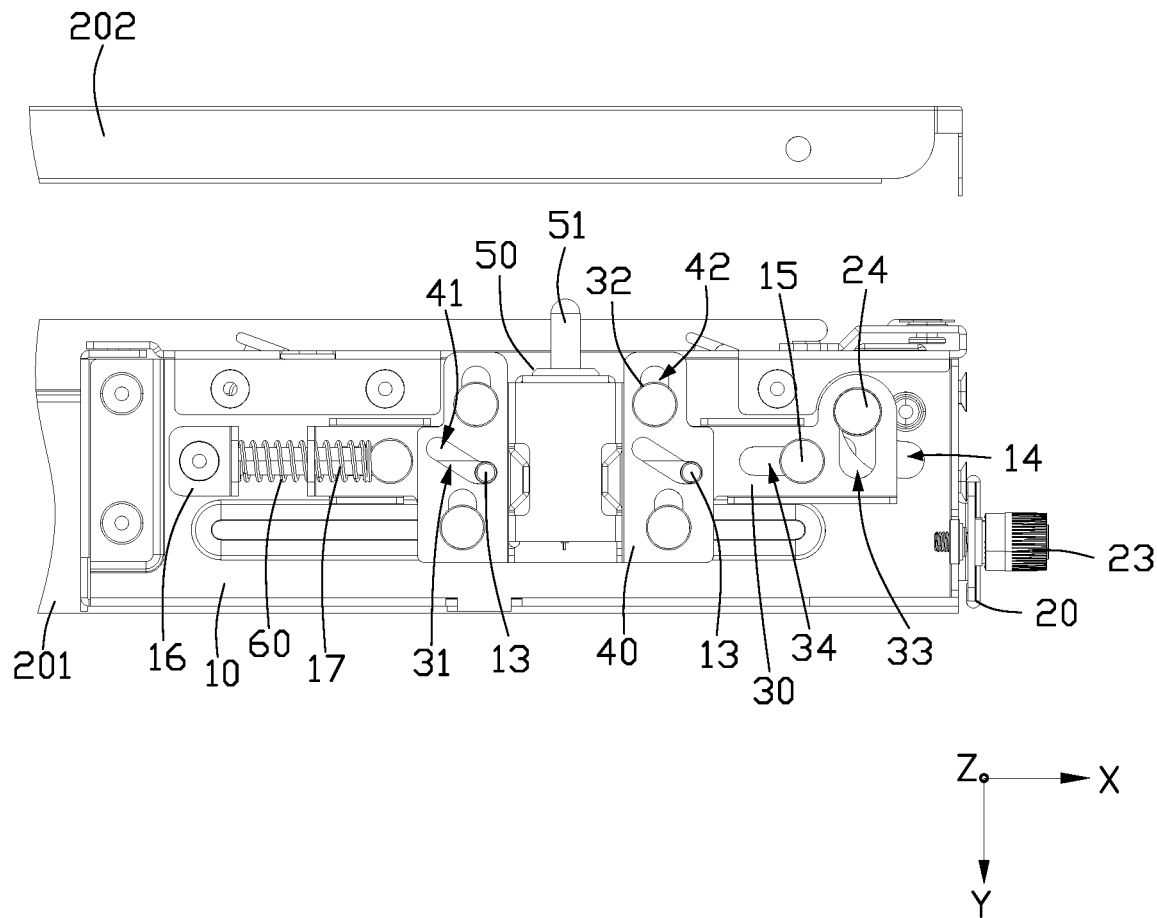
FIG. 8 illustrates a partial schematic diagram of the cover of the electronic device of FIG. 1, the cover is opened according to an example embodiment of the present application.

In some embodiments, referring to FIG. 7, the second slide slot 41 includes a first section 411 and a second section 412. The first section 411 is extended along the first direction X, the second section 412 is extended along a direction that forms a second angle less than 90 degrees with the second direction. The first section 411 is extended along the first direction X, which may be beneficial to the first slide piece 13 to support the second movable rack 40 when the first slide piece 13 is inserted into the first section 411, so as to fix the second movable rack 40 and decrease a gravity action of the second movable rack 40 and drive the first movable rack 30 and the door assembly 20 to move.

In some embodiments, referring to FIGS. 4, 5, and 6, a quantity of each of the first slide piece 13, the first slide slot 31, and the second slide slot 41 may be one or more.

In some embodiments, referring to FIGS. 4, 5, and 6, the second movable rack 40 includes a third slide slot 42 extended along the second direction Y. The first movable rack 30 includes a second slide piece 32. The second slide piece 32 is inserted into the third slide slot 42, so the second slide piece 32 may move along the third slide slot 42 and move relative to the second movable rack 40. The second movable rack 40 and the first movable rack 30 may be movably connected through an engagement of the second slide piece 32 and the third slide slot 42, so the second movable rack 40 may provide guiding function, the second movable rack 40 may move more stably and smoothly, a movement of the second movable rack 40 relative to the first movable rack 30 may be limited.

In some embodiments, referring to FIGS. 4, 5, and 6, the second slide piece 32 is inserted into the third slide slot 42 and at least partially positioned at a side of the second movable rack 40 opposite to the first movable rack 30, a dimeter of the part of the second slide piece 32 positioned at the side of the second movable rack 40 opposite to the first movable rack 30 may be greater than a width of the third slide slot 42 in the first direction X, which may be decrease a risk of the second movable rack 40 separating from the first movable rack 30, and improve a stability of the movable connection of the first movable rack 30 and the second movable rack 40.

In some embodiments, referring to FIGS. 4, 5, and 6, a quantity of each of the second slide piece 32 and the third slide slot 42 may be one or more.

In some embodiments, referring to FIGS. 4, 5, and 6, the first movable rack 30 includes a fourth slide slot 33 extended along the second direction Y. In the embodiments of the door assembly 20 including the board 21 and the rotation pieces 22, the door assembly 20 further includes a third slide piece 24 connected to the rotation pieces 22, the third slide piece 24 is inserted into the fourth slide slot 33, when the rotation pieces 22 rotate, the third slide piece 24 drives the first movable rack 30 to move forward or return along the first direction X or the counter direction of the first direction X. The engagement of the third slide piece 24 and the fourth slide slot 33, renders the first movable rack 30 may be movably connected to the rotation pieces 22, so the first movable rack 30 may be movably connected to the door assembly 20. The engagement of the third slide piece 24 and the fourth slide slot 33 may be beneficial to a rotation of the board 21, the first movable rack 30 moves forward or return along the first direction X or the counter direction of the first direction X, which may drive the second movable rack 40 to move forward or return along the second direction Y or the counter direction of the second direction Y.

In some embodiments, referring to FIGS. 4, 5, and 6, the mounting rack 10 defines a fifth slide slot 14 extended along a rotation path of the third slide piece 24. The third slide piece 24 is inserted through the fifth slide slot 14 and inserted into the fourth slide slot 33. The fifth slide slot 14 may provide guiding for the third slide piece 24, so the third slide piece 24 may move stably and limit the movement of the rotation pieces 22, which may improve a reliability of the detection mechanism 100.

In some embodiments, referring to FIGS. 4, 5, and 6, the fifth slide slot 14 may be an arc-shaped slot.

In some embodiments, referring to FIGS. 4, 5, and 6, a quantity of each of the third slide piece 24, the fourth slide slot 33, and the fifth slide slot 14 may be one or more.

In some embodiments, referring to FIGS. 4, 5, and 6, the first movable rack 30 defines a sixth slide slot 34 extended along the first direction X. The mounting rack 10 further includes a fourth slide piece 15, the fourth slide piece 15 is inserted into the sixth slide slot 34, so the movable connection of the first movable rack 30 and the mounting rack 10 may be more stable. An engagement of the fourth slide piece 15 and the sixth slide slot 34 may provide guiding for the movement of the first movable rack 30 and improve the stability of the movement of the first movable rack 30.

In some embodiments, referring to FIGS. 4, 5, and 6, the fourth slide piece 15 is inserted into the sixth slide slot 34 and at least partially positioned at a side of the first movable rack 30 opposite to the mounting rack 10, a dimeter of the part of the fourth slide piece 15 positioned at the side of the first movable rack 30 opposite to the mounting rack 10 may be greater than a width of the sixth slide slot 34 in the second direction Y, which may be decrease a risk of the first movable rack 30 separating from the mounting rack 10, and improve a stability of the movable connection of the first movable rack 30 and the mounting rack 10.

In some embodiments, a quantity of each of the fourth slide piece 15 and the sixth slide slot 34 may be one or more.

In some embodiments, when the detection assembly 50 detects that the cover 202 is away from the mounting rack 10 or the door assembly 20 opens the opening 12, the detection assembly 50 outputs a predetermined signal, a controller (not shown) of the electronic device 1000 may power off the electronic device 1000 when receiving the predetermined signal, so the operator may switch the storage module 300 and maintain internal components of the electronic device 1000.

In some embodiments, the electronic device 1000 may include an identifier (not shown), the identifier may be an internal component of the electronic device 1000 or an external device. When the identifier does not identify the operator, and when the detection assembly 50 detects that the cover 202 is away from the mounting rack 10 or the door assembly 20 opens the opening 12, the detection assembly 50 outputs the predetermined signal, the controller of the electronic device 1000 may output an alarm when receiving the predetermined signal, which may improve a safety.

In some embodiments, referring to FIGS. 5 and 6, when the door assembly 20 rotates and opens the opening 12, the door assembly 20 drives the first movable rack 30 to move along the first direction X, the first movable rack 30 drives the second movable rack 40 to move along the second direction Y, the detection assembly 50 connected to the second movable rack 40 moves together with the second movable rack 40 along the second direction Y away from the cover 202, the detection assembly 50 detects that the detection assembly 50 is away from the cover 202 and outputs the predetermined signal.

In some embodiments, referring to FIGS. 5, 6, 7, and 8, the detection assembly 50 includes an extendable portion 51 for triggering the detection assembly 50. The extendable portion 51 may be configured to contact with the cover 202. The cover 202 may compress the extendable portion 51 along the second direction Y, when disassembling or opening the cover 202, the cover 202 move away from the mounting rack 10 along the second direction Y, meanwhile away from the extendable portion 51, until not compressing the extendable portion 51, the extendable portion 51 extends to trigger the detection assembly 50, so the detection assembly 50 detects that the cover 202 is away from the mounting rack 10.

In some embodiments, referring to FIGS. 5 and 6, when the cover 202 is not dissembled or open, and when the door assembly 20 opens the opening 12, the detection assembly 50 connected to the second movable rack 40 moves together with the second movable rack 40, so the extendable portion 51 may move away from the cover 202, until the cover 202 no longer compresses the extendable portion 51, the extendable portion 51 extends to trigger the detection assembly 50.

In some embodiments, referring to FIGS. 5 and 6, the detection mechanism 100 further includes an elastic piece 60 mounted to the mounting rack 10. The elastic piece 60 may elastically act on the first movable rack 30 along the first direction X or the counter direction of the first direction X to provide a force for the door assembly 20 to maintain the open of the opening 12. The elastic piece 60 may provide the force for the door assembly 20 to maintain the open of the opening 12, so the operator may mount or dissemble the storage module 300 in the receiving room 11, an operating risk to the operator caused by rotation of the door assembly 20 due to gravity action may be decreased.

In some embodiments, referring to FIGS. 5 and 6, the mounting rack 10 includes a supporting piece 16 and a guiding rod 17. The supporting piece 16 may be connected to the guiding rod 17, the guiding rod 17 extends along the first direction X. The first movable rack 30 defines a guiding hole 35, the guiding rod 17 is inserted into the guiding hole 35, the elastic piece 60 is arranged on the guiding rod 17, an end of the elastic piece 60 may be resisted to the supporting piece 16, another end of the elastic piece 60 may be resisted to the first movable rack 30, so the elastic piece 60 may elastically act on the first movable rack 30 in the first direction X. Thus, the elastic piece 60 may be mounted stably, a risk of separating the elastic piece 60 may be decreased, the reliability of the detection mechanism 100 may be further improved.

While the present disclosure has been described with reference to particular embodiments, the description is illustrative of the disclosure and is not to be construed as limiting the disclosure. Therefore, those of ordinary skill in the art may make various modifications to the embodiments without departing from the scope of the disclosure, as defined in the appended claims.

What is claimed is:

1. A detection mechanism applied in an electronic device, the electronic device comprising a cover, the detection mechanism comprising:
   a mounting rack defining a receiving room and an opening communicated with the receiving room;
   a door assembly rotatably connected to the mounting rack, the door assembly configured to rotate relative to the mounting rack to cover or uncover the opening;
   a first movable rack movably connected to the mounting rack and the door assembly, the first movable rack configured to move forward or return along a first direction or a counter direction of the first direction when the door assembly rotates;
   a second movable rack movably connected to the first movable rack, the second movable rack configured to move forward or return along a second direction or a counter direction of the second direction when the first movable rack moves forward or return along the first direction or the counter direction of the first direction, wherein the second direction is perpendicular to the first direction; and
   a detection assembly connected to the second movable rack, the detection assembly configured to detect whether the cover is away from the mounting rack, the detection assembly further configured to move with the second movable rack to detect whether the opening is not covered by the door assembly;
   wherein the first movable rack comprises a first slide slot extended along the first direction, the mounting rack comprises a first slide piece, the first slide piece is inserted into the first slide slot, the first slide piece is slidable along the first slide slot and movable relative to the first movable rack;
   the second movable rack comprises a second slide slot, at least a part of an extended direction of the second slide slot forms an angle with the first direction, the angle is less than 90 degrees, the first slide piece is inserted through the first slide slot and inserted into the second slide slot, the first slide piece is capable of slidable along the second slide slot and movable relative to the second movable rack.

2. The detection mechanism according to claim 1, wherein the second slide slot comprises a first section and a second section, the first section is extended along the first direction, the second section is extended along a direction that forms a second angle, with the second direction, the second angle is less than 90 degrees.

3. The detection mechanism according to claim 1, wherein the second movable rack further comprises a third slide slot extended along the second direction, the first movable rack further comprises a second slide piece, the second slide piece is inserted into the third slide slot, the second slide piece is movable along the third slide slot and movable relative to the second movable rack.

4. The detection mechanism according to claim 1, wherein the door assembly comprises a board and a plurality of rotation pieces, the plurality of rotation pieces is connected to the board, the plurality of rotation pieces is rotatably connected to the mounting rack and movably connected to the first movable rack.

5. The detection mechanism according to claim 4, wherein the first movable rack comprises a fourth slide slot extended along the second direction, the door assembly further comprises a third slide piece connected to the rotation pieces, the third slide piece is inserted into the fourth slide slot, the third slide piece drives the first movable rack to move forward or return along the first direction and the counter direction of the first direction when the rotation pieces rotate.

6. The detection mechanism according to claim 5, wherein the mounting rack further defines a fifth slide slot extended along a rotation path of the third slide piece, the third slide piece is inserted through the fifth slide slot and inserted into the fourth slide slot.

7. The detection mechanism according to claim 4, wherein the door assembly further comprises fixed pieces connected to the board, the fixed pieces are configured to fasten the mounting rack.

8. The detection mechanism according to claim 1, further comprising an elastic piece mounted to the mounting rack, wherein the elastic piece elastically acts on the first movable rack along the first direction or the counter direction of the first direction to resist the door assembly from covering the opening.

9. An electronic device comprising:
a housing defining a receiving chamber, the housing comprising a cover; and
a detection mechanism, at least a part of the detection mechanism received in the receiving chamber, the detection mechanism comprising:
a mounting rack defining a receiving room and an opening communicated with the receiving room;
a door assembly rotatably connected to the mounting rack, the door assembly configured to rotate relative to the mounting rack to cover or uncover the opening;
a first movable rack movably connected to the mounting rack and the door assembly, the first movable rack configured to move forward or return along a first direction or a counter direction of the first direction when the door assembly rotates;
a second movable rack movably connected to the first movable rack, the second movable rack configured to move forward or return along a second direction or a counter direction of the second direction when the first movable rack moves forward or return along the first direction or the counter direction of the first direction, wherein the second direction is perpendicular to the first direction, the cover positioned on a side of the detection mechanism in the second direction; and
a detection assembly connected to the second movable rack, the detection assembly configured to detect whether the cover is away from the mounting rack, the detection assembly further configured to move with the second movable rack to detect whether the opening is not covered by the door assembly;
wherein the first movable rack comprises a first slide slot extended along the first direction. the mounting rack comprises a first slide piece, the first slide piece is inserted into the first slide slot, the first slide piece is slidable along the first slide slot and movable relative to the first movable rack;
the second movable rack comprises a second slide slot, at least a part of an extended direction of the second slide slot forms an angle with the first direction, the angle is less than 90 degrees. the first slide piece is inserted through the first slide slot and inserted into the second slide slot, the first slide piece is capable of slidable along the second slide slot and movable relative to the second movable rack.

10. The electronic device according to claim 9, wherein the second slide slot comprises a first section and a second section, the first section is extended along the first direction, the second section is extended along a direction that forms a second angle, with the second direction, the second angle is less than 90 degrees.

11. The electronic device according to claim 9, wherein the second movable rack further comprises a third slide slot extended along the second direction, the first movable rack further comprises a second slide piece, the second slide piece is inserted into the third slide slot, the second slide piece is movable along the third slide slot and movable relative to the second movable rack.

12. The electronic device according to claim 9, wherein the door assembly comprises a board and a plurality of rotation pieces, the plurality of rotation pieces is connected to the board, the plurality of rotation pieces is rotatably connected to the mounting rack and movably connected to the first movable rack.

13. The electronic device according to claim 12, wherein the first movable rack comprises a fourth slide slot extended along the second direction, the door assembly further comprises a third slide piece connected to the rotation pieces, the third slide piece is inserted into the fourth slide slot, the third slide piece drives the first movable rack to move forward or return along the first direction and the counter direction of the first direction when the rotation pieces rotate.

14. The electronic device according to claim 13, wherein the mounting rack further defines a fifth slide slot extended along a rotation path of the third slide piece, the third slide piece is inserted through the fifth slide slot and inserted into the fourth slide slot.

15. The electronic device according to claim 12, wherein the door assembly further comprises fixed pieces connected to the board, the fixed pieces are configured to fasten the mounting rack.

16. The electronic device according to claim 9, wherein the detection mechanism further comprises an elastic piece mounted to the mounting rack, the elastic piece elastically acts on the first movable rack along the first direction or the counter direction of the first direction to resist the door assembly from covering the opening.

* * * * *